United States Patent
Chang et al.

(10) Patent No.: US 9,721,956 B2
(45) Date of Patent: Aug. 1, 2017

(54) METHODS, STRUCTURES AND DEVICES FOR INTRA-CONNECTION STRUCTURES

(71) Applicant: Taiwan Semiconductor Manufacturing Company Limited, Hsinchu (TW)

(72) Inventors: Feng-Ming Chang, Hsinchu County (TW); Kuo-Hsiu Hsu, Taoyuan County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 82 days.

(21) Appl. No.: 14/278,375

(22) Filed: May 15, 2014

(65) Prior Publication Data

US 2015/0333073 A1    Nov. 19, 2015

(51) Int. Cl.
| | | |
|---|---|---|
| H01L 27/11 | (2006.01) | |
| H01L 27/02 | (2006.01) | |
| H01L 21/768 | (2006.01) | |
| H01L 23/485 | (2006.01) | |

(52) U.S. Cl.
CPC .... *H01L 27/1104* (2013.01); *H01L 21/76895* (2013.01); *H01L 21/76897* (2013.01); *H01L 23/485* (2013.01); *H01L 27/0207* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 4,951,112 A | * | 8/1990 | Choi | ............ G11C 11/412 257/380 |
| 5,899,742 A | * | 5/1999 | Sun | ............ H01L 21/76895 148/DIG. 19 |
| 6,274,409 B1 | * | 8/2001 | Choi | ............ H01L 21/76895 257/E21.507 |

(Continued)

FOREIGN PATENT DOCUMENTS

| | | |
|---|---|---|
| JP | 2007103862 | 4/2007 |
| JP | 2007109973 | 4/2007 |

(Continued)

OTHER PUBLICATIONS

Korean Notice of Allowance; Application No. 10-2014-0163687; dated Nov. 27, 2015.

(Continued)

*Primary Examiner* — Andres Munoz
(74) *Attorney, Agent, or Firm* — Jones Day

(57) ABSTRACT

Systems and methods are provided for forming an intra-connection structure. A first gate structure and a first source/drain region adjacent to the first gate structure are formed on a substrate. A first dielectric material is disposed on the first source/drain region. A spacer material is formed on the first gate structure. The first dielectric material is removed to expose the first source/drain region. At least part of the spacer material is removed to expose the first gate structure. A first conductive material is formed between the first gate structure and the first source/drain region to electrically connect the first source/drain region and the first gate structure.

28 Claims, 16 Drawing Sheets

(56) References Cited

U.S. PATENT DOCUMENTS

| | | | | |
|---|---|---|---|---|
| 7,510,960 B2* | 3/2009 | Toomey | ............ | H01L 21/76813 |
| | | | | 257/503 |
| 2007/0080423 A1* | 4/2007 | Tsuboi | ................... | H01L 27/11 |
| | | | | 257/506 |
| 2010/0237419 A1* | 9/2010 | Yang | .................. | H01L 27/0207 |
| | | | | 257/368 |
| 2012/0211843 A1* | 8/2012 | Jung | ............... | H01L 21/823412 |
| | | | | 257/401 |

FOREIGN PATENT DOCUMENTS

| | | |
|---|---|---|
| KR | 20010076341 | 8/2001 |
| KR | 20020072844 | 9/2002 |
| KR | 20140043019 | 4/2014 |
| KR | 20140048789 | 4/2014 |

OTHER PUBLICATIONS

Korean Office Action; Application No. 10-2014-0163687; dated Aug. 21, 2015.
Korean Office Action; Application No. 10-2014-0163695; dated Nov. 30, 2015.
Korean Notice of Allowance; Application No. 10-2014-0163695; dated Dec. 26, 2016.

* cited by examiner (D)

US 9,721,956 B2

METHODS, STRUCTURES AND DEVICES FOR INTRA-CONNECTION STRUCTURES

BACKGROUND

The technology described in this disclosure relates generally to semiconductor devices and more particularly to fabrication of semiconductor devices.

Static random access memory (SRAM) devices are widely used for electronic applications where high speed, low power consumption and simple operations are needed. A SRAM device often includes a number of memory cells, and each cell may contain multiple components, such as transistors, active areas of the transistors, intra-cell connections, and contacts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
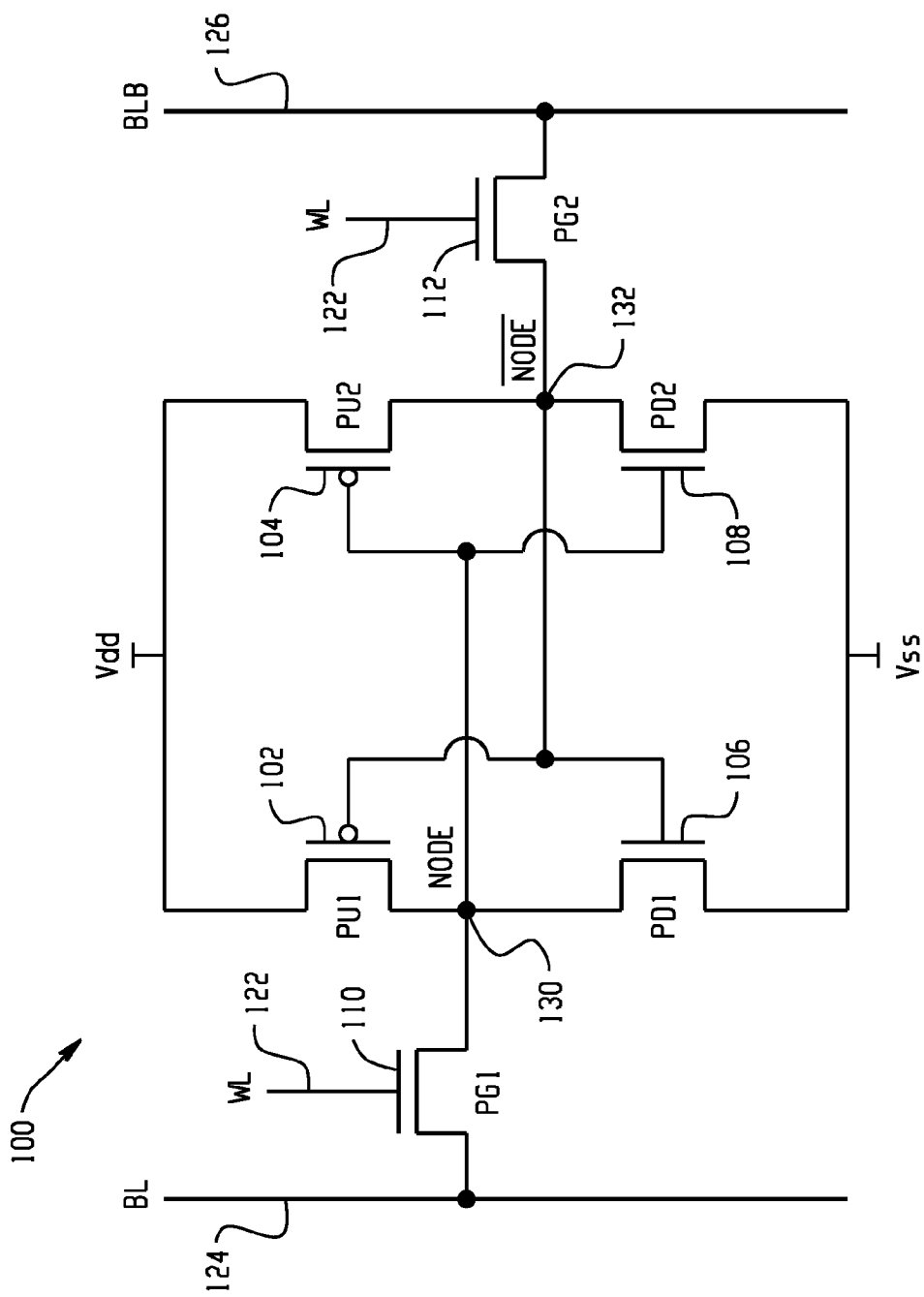
FIG. 1 depicts an example diagram of a six-transistor (6-T) SRAM cell, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "in," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As feature sizes of semiconductor devices continue to shrink, various problems may emerge in device fabrication. For SRAM devices, as the memory cell size becomes smaller, individual components in the memory cell, such as transistors, active areas of the transistors, intra-cell connections, and contacts, would naturally need to become smaller. However, current lithography and etching techniques limit how much the individual components can be shrunk. Thus, a memory cell of a SRAM device that includes a large density of components often has overlay problems. Any overlay would lead to a short circuit between different components and may cause device failure.

FIG. 1 depicts an example diagram of a six-transistor (6-T) SRAM cell, in accordance with some embodiments. As shown in FIG. 1, the SRAM cell 100 includes two pull-up transistors 102 ("PU1") and 104 ("PU2"), two pull-down transistors 106 ("PD1") and 108 ("PD2"), and two pass-gate transistors 110 ("PG1") and 112 ("PG2"). The transistors 102, 104, 106 and 108 are connected in cross-coupled inverter configuration. That is, the transistors 102 and 106 form a first inverter, and the transistors 104 and 108 form a second inverter. Gate terminals of the pass-gate transistors 110 and 112 are both configured to receive a word-line signal 122 ("WL"). A pair of complementary bit lines 124 ("BL") and 126 ("BLB") are coupled to source/drain regions of the pass-gate transistors 110 and 112 respectively. The pass-gate transistors 110 is coupled to the pull-up transistor 102 and the pull-down transistor 106 at a node 130, and the pass-gate transistors 112 is coupled to the pull-up transistor 104 and the pull-down transistor 108 at another node 132. For example, the pull-up transistors 102 and 104 are P-channel transistors, and the pull-down transistors 106 and 108 are N-channel transistors. The pass-gate transistors 110 and 112 are N-channel transistors.

Figure 2:
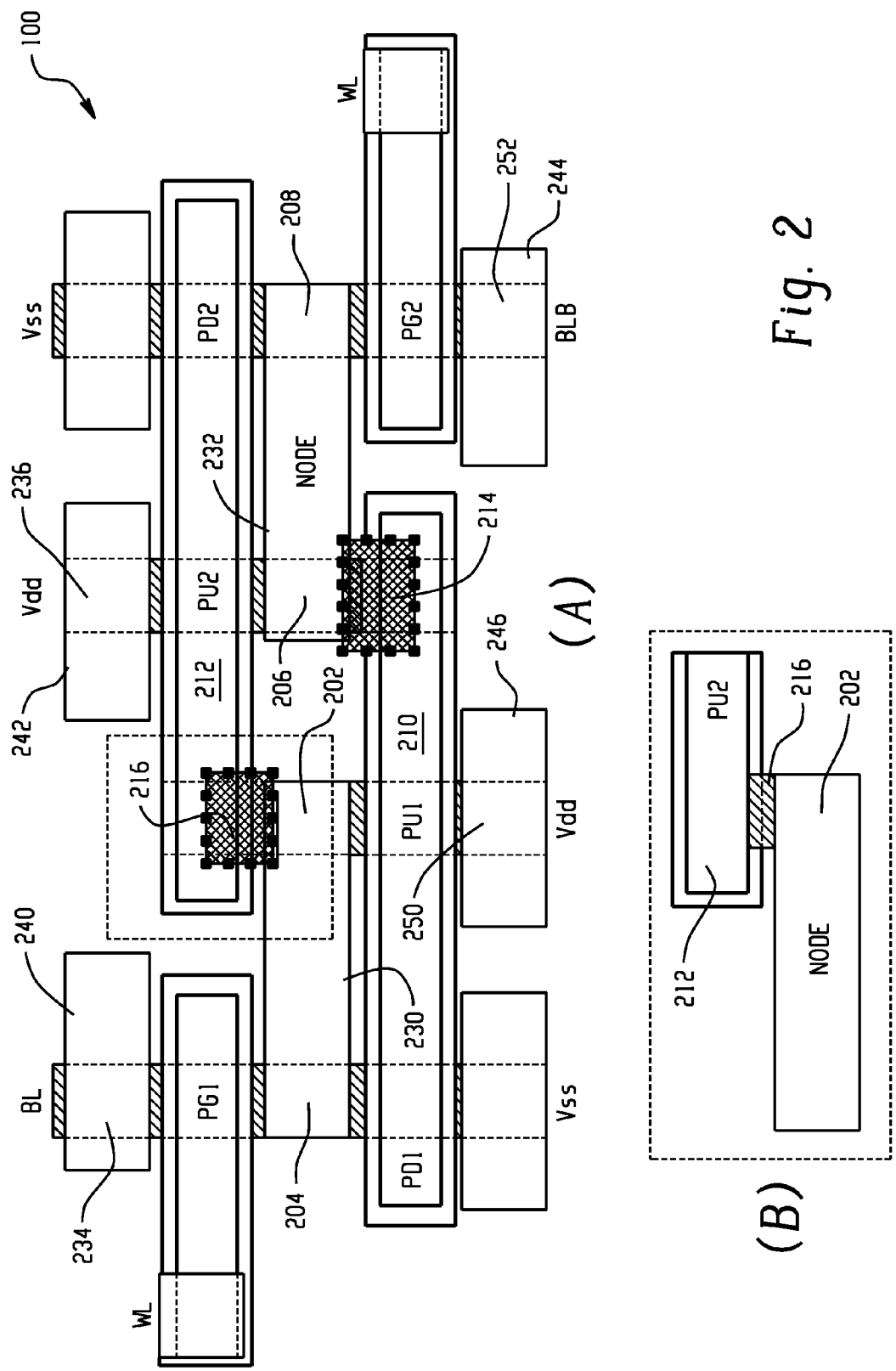
FIG. 2(A) depicts an example layout diagram of the SRAM cell as shown in FIG. 1, in accordance with some embodiments.
FIG. 2(B) depicts an example diagram showing an intra-connection structure as shown in FIG. 2(A), in accordance with some embodiments.

FIG. 2(A) depicts an example layout diagram of the SRAM cell as shown in FIG. 1, in accordance with some embodiments. As shown in FIG. 2(A), the transistors 102, 104, 106 and 108 are interconnected (e.g., through metal contacts, contact bars, or slot contacts). A source/drain region 202 of the transistor 102 ("PU1") is connected to a source/drain region 204 of the transistor 106 ("PD1") through a conduction structure 230 that corresponds to the node 130. A source/drain region 206 of the transistor 104 ("PU2") is connected to a source/drain region 208 of the transistor 108 ("PD2") through a conduction structure 232 that corresponds to the node 132.

Furthermore, an intra-connection structure 214 connects a gate structure 210 of the transistor 102 ("PU1") and the source/drain region 206 of the transistor 104 ("PU2") laterally, so as to avoid overlay problems associated with vertical connection structures. As the intra-connection structure 214 is disposed laterally between the gate structure 210 and the source/drain region 206, the intra-connection structure 214 may not come into contact with a conduction structure 244 associated with a source/drain region 252 of the pass-gate transistor 112 ("PG2") or a conduction structure 246 associated with a source/drain region 250 of the transistor 102 ("PU1").

Similarly, another intra-connection structure 216 connects a gate structure 212 of the transistor 104 ("PU2") and the source/drain region 202 of the transistor 102 ("PU1") laterally. As the intra-connection structure 216 is disposed laterally between the gate structure 212 and the source/drain region 202, the intra-connection structure 216 may not come into contact with a conduction structure 240 associated with a source/drain region 234 of the pass-gate transistor 110 ("PG1") or a conduction structure 242 associated with a source/drain region 236 of the transistor 104 ("PU2").

For example, the conduction structure 230 and the conduction structure 232 include one or more conductive materials (e.g., metal-based materials). The intra-connection structure 214 and the intra-connection structure 216 include one or more conductive materials (e.g., metal-based materials). The gate structure 210 and the gate structure 212 include one or more conductive materials (e.g., metal-based materials, polysilicon).

FIG. 2(B) depicts an example diagram showing the intra-connection structure 216, in accordance with some embodiments. As shown in FIG. 2(B), the gate structure 210 of the transistor 102 ("PU1") is electrically connected to the source/drain region 206 of the transistor 104 ("PU2") through the intra-connection structure 216. Specifically, the intra-connection structure 216 is in contact with one side of the gate structure 212 of the transistor 104 ("PU2").

Figure 3:
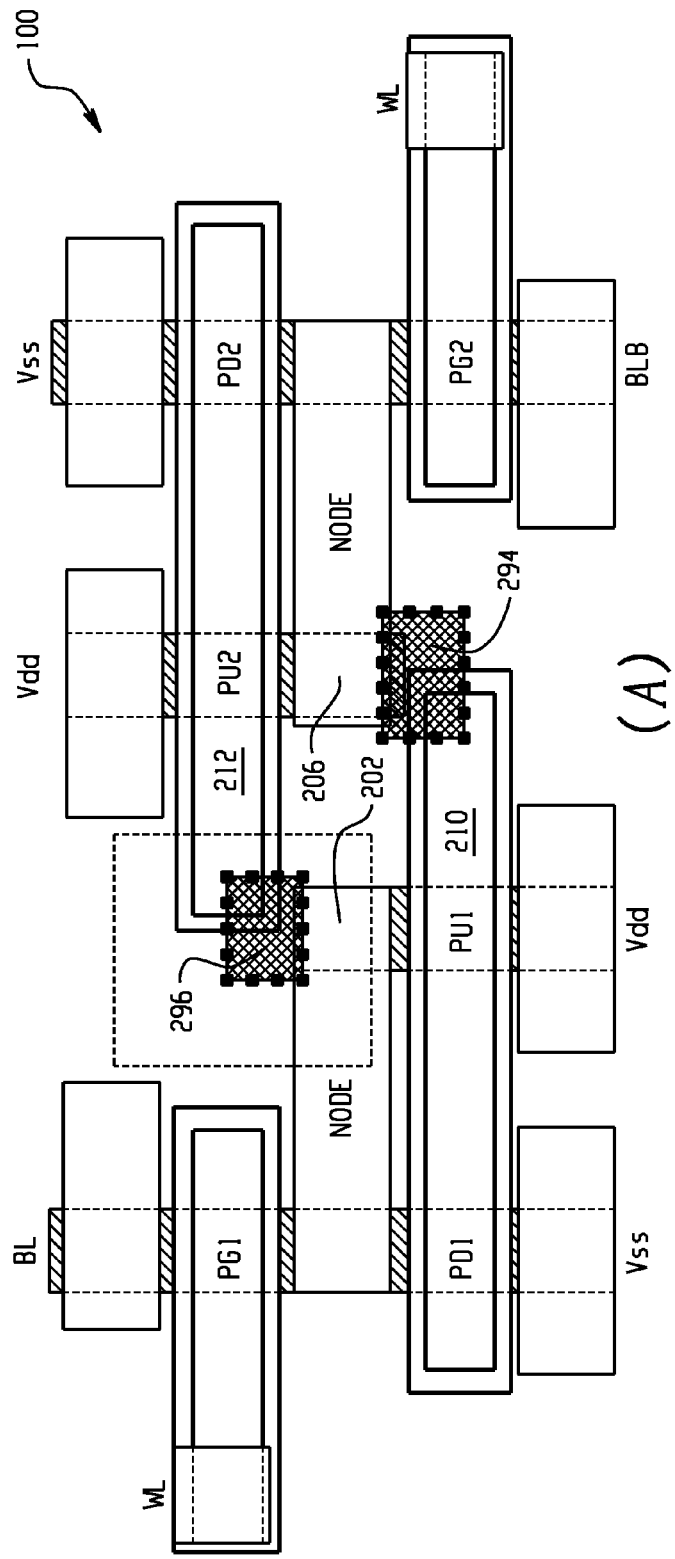
FIG. 3(A) depicts another example layout diagram of the SRAM cell as shown in FIG. 1, in accordance with some embodiments.
FIG. 3(B) depicts an example diagram showing an intra-connection structure as shown in FIG. 3(A), in accordance with some embodiments.

FIG. 3(A) depicts another example layout diagram of the SRAM cell as shown in FIG. 1, in accordance with some embodiments. As shown in FIG. 3(A), the transistors 102, 104, 106 and 108 are interconnected (e.g., through metal contacts, contact bars, or slot contacts), similar to FIG. 2(A). An intra-connection structure 294 connects the gate structure 210 of the transistor 102 ("PU1") and the source/drain region 206 of the transistor 104 ("PU2") laterally. Similarly, another intra-connection structure 296 connects the gate structure 212 of the transistor 104 ("PU2") and the source/drain region 202 of the transistor 102 ("PU1") laterally.

FIG. 3(B) depicts an example diagram showing the intra-connection structure 296, in accordance with some embodiments. As shown in FIG. 3(B), the gate structure 210 of the transistor 102 ("PU1") is electrically connected to the source/drain region 206 of the transistor 104 ("PU2") through the intra-connection structure 296. Specifically, the intra-connection structure 296 is in contact with one side and an end of the gate structure 212 of the transistor 104 ("PU2").

Figure 4:
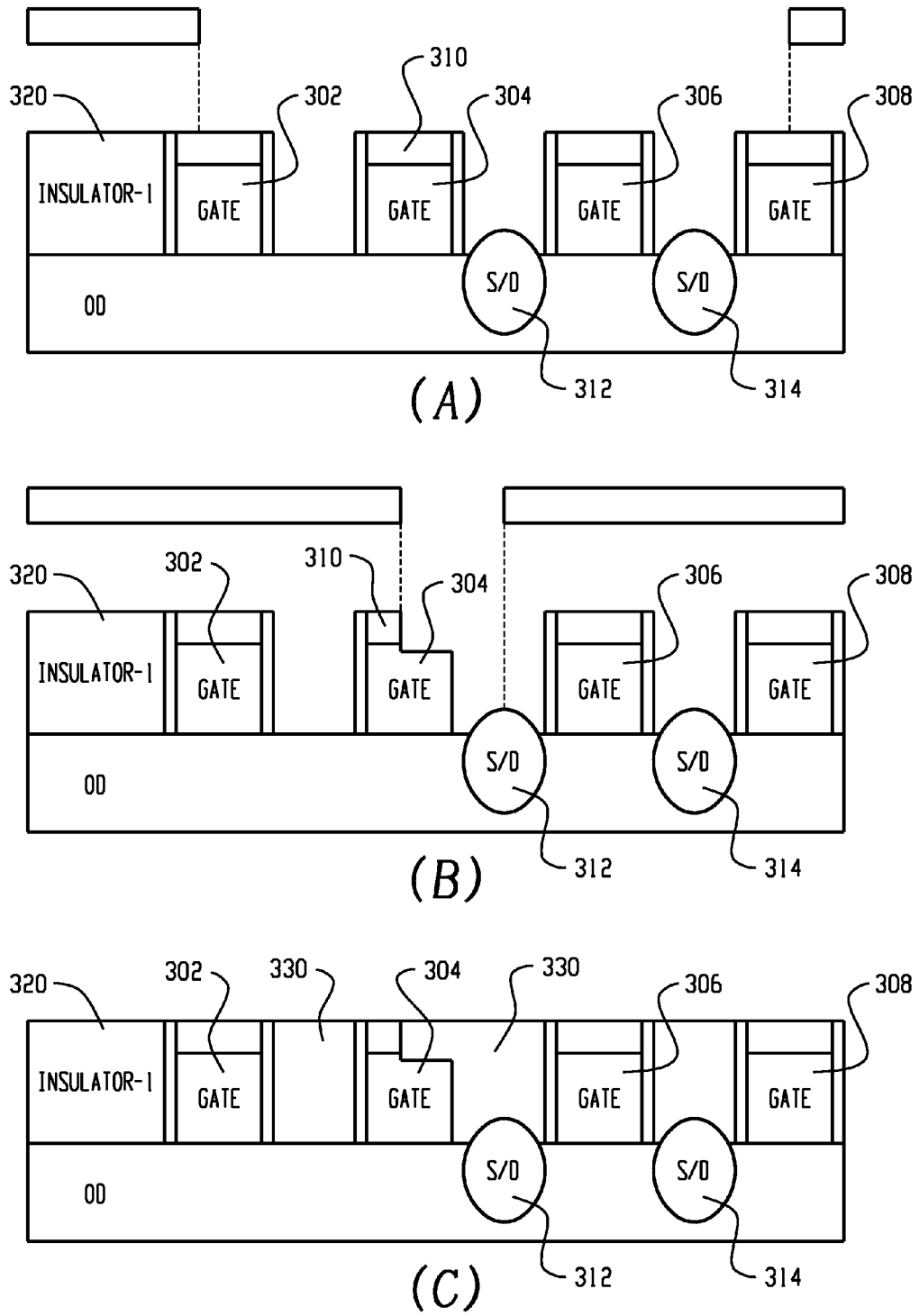
FIG. 4(A)-FIG. 4(D) depict example diagrams showing a process for fabricating a device structure including an intra-connection structure, in accordance with some embodiments.
Figure 4:
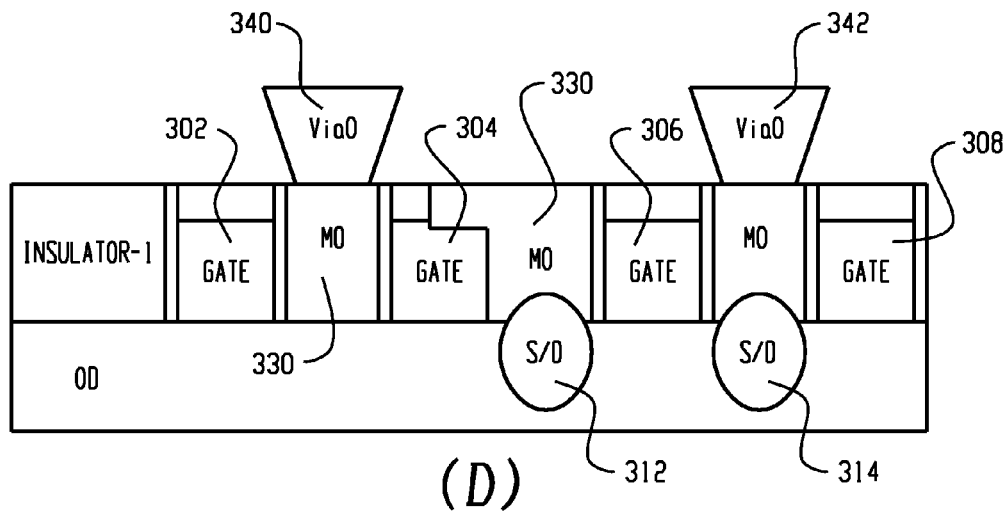

FIG. 4(A)-FIG. 4(D) depict example diagrams showing a process for fabricating a device structure including an intra-connection structure, in accordance with some embodiments. One or more fabrication processes (e.g., lithography, deposition, and/or etching) may be carried out to yield a structure as shown in FIG. 4(A). For example, a sacrificial dielectric material (e.g., an insulating material 320) that is formed between multiple gate structures (e.g., the gate structures 302, 304, 306 and 308) is removed (e.g., through etching) after a lithography process. One or more source/drain regions (e.g., the source/drain regions 312 and 314) are disposed between the gate structures and exposed at least partially after the removal of the sacrificial dielectric material. A spacer material is disposed on each gate structure. As shown in FIG. 4(A), the spacer material 310 covers at least part of the gate structure 304, e.g., on a top surface and sidewalls of the gate structure 304. For example, the spacer material 310 includes a dielectric material (e.g., silicon nitride).

Another lithography process is performed, and part of the spacer material 310 is removed (e.g., through etching) to expose part of the gate structure 304, as shown in FIG. 4(B). For example, the spacer material 310 on the top surface of the gate structure 304 is partially removed. In addition, the spacer material 310 on a side wall of the gate structure 304 adjacent to the source/drain region 312 is removed.

A conductive material 330 is formed (e.g., through lithography, deposition, etc.) on the gate structures and the source/drain regions. Chemical-mechanical planarization (CMP) is performed to remove part of the conductive material 330, as shown in FIG. 4(C). The conductive material 330 is in contact with the exposed gate structure 304 and the exposed source/drain regions 312 and is configured to electrically connect the gate structure 304 and the source/drain regions 312. For example, the conductive material 330 covers part of the top surface of the gate structure 304.

Another conductive material is formed (e.g., through lithography, deposition, etc.) to fabricate multiple vertical conduction structures (e.g., vias). As shown in FIG. 4(D), a vertical conduction structure 340 (e.g., a via) is formed on the conductive material 330 between the gate structure 302 and the gate structure 304, and another vertical conduction structure 342 (e.g., a via) is formed on the conductive material 330 between the gate structure 306 and the gate structure 308. The conductive material 330 between the gate structure 304 and the gate structure 306 serves as an intra-connection structure (e.g., the intra-connection structure 214 or the intra-connection structure 216 as shown in FIG. 2(A), the intra-connection structure 294 or the intra-connection structure 296 as shown in FIG. 3(A)).

Figure 5:
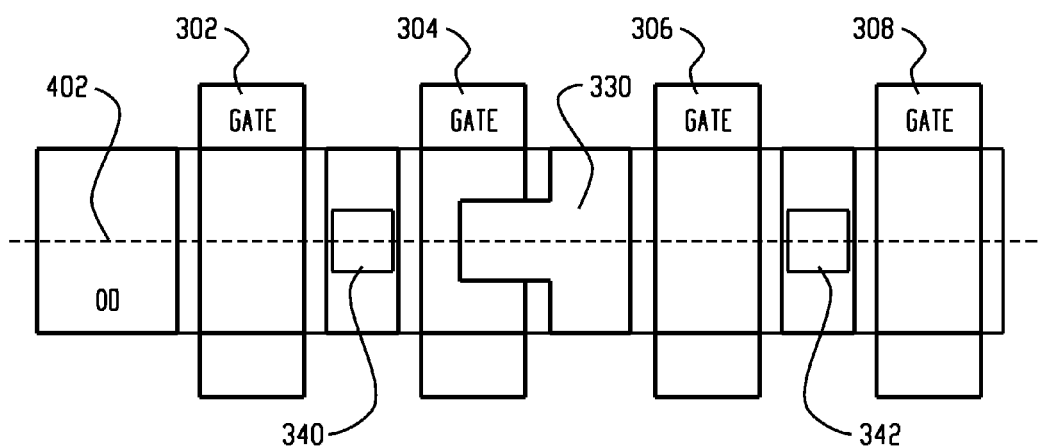
FIG. 5 depicts an example diagram showing a top view of the device structure as shown in FIG. 4(D), in accordance with some embodiments.

FIG. 5 depicts an example diagram showing a top view of the device structure as shown in FIG. 4(D), in accordance with some embodiments. As shown in FIG. 4(D) and FIG. 5, the conduction structures 340 and 342 have a smaller width at the bottom to reduce the risk of contacting the intra-connection structure that includes the conductive material 330 between the gate structures 304 and 306. The cross-sectional view shown in FIG. 4(D) is associated with the cutline 402.

Figure 6:
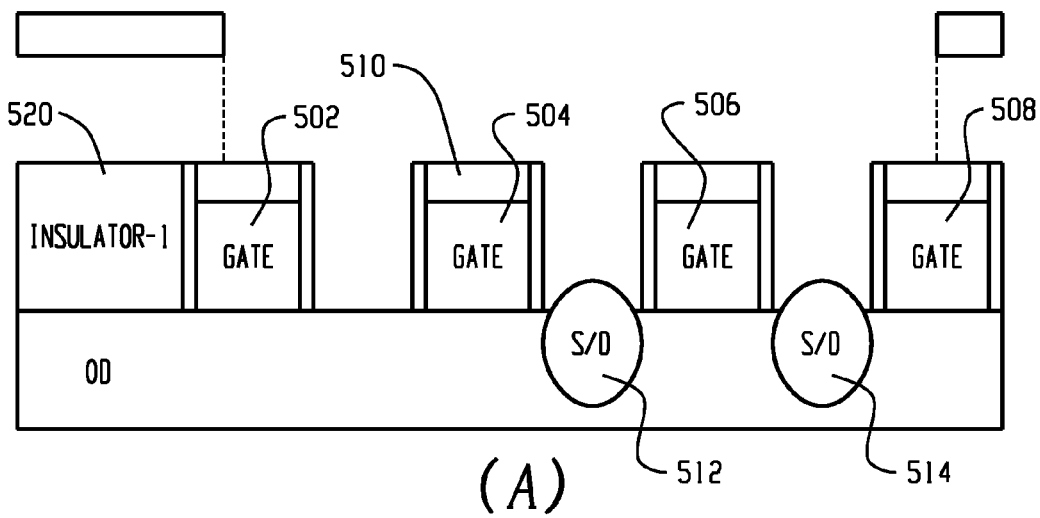
FIG. 6(A)-FIG. 6(D) depict example diagrams showing another process for fabricating a device structure including an intra-connection structure, in accordance with some embodiments.
Figure 6:
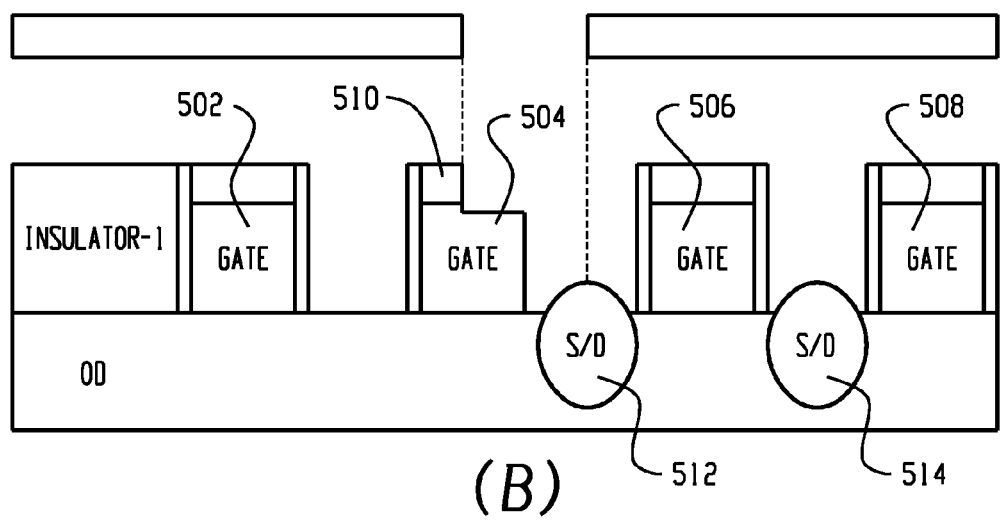
Figure 6:
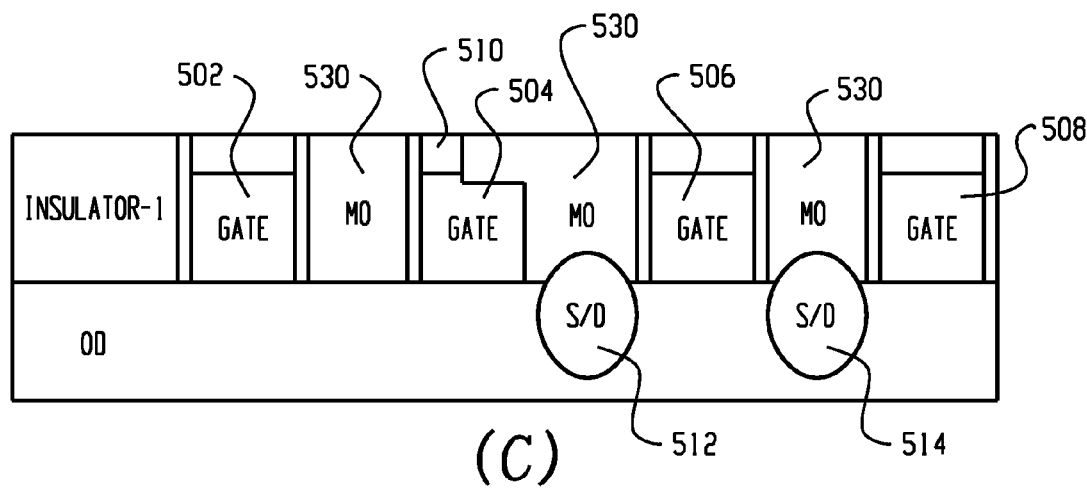
Figure 6:
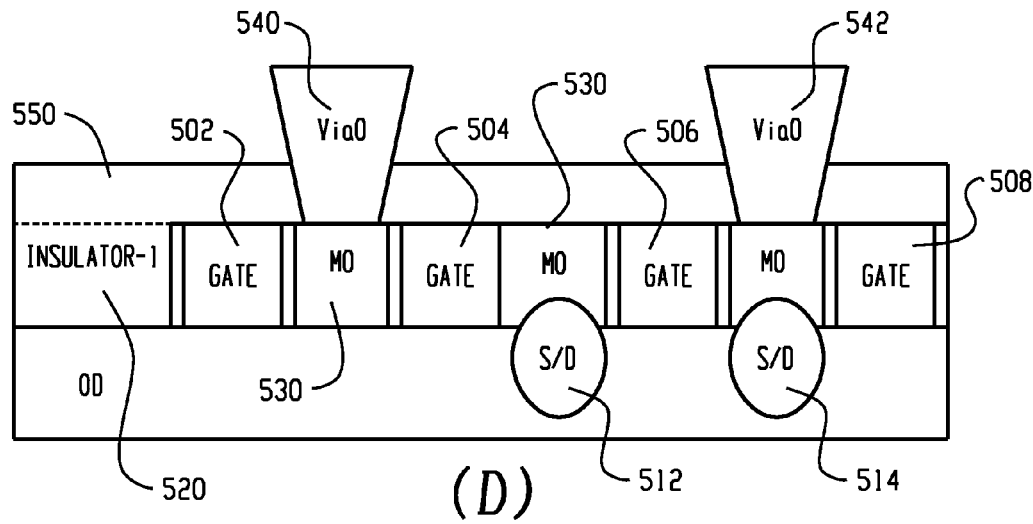

FIG. 6(A)-FIG. 6(D) depict example diagrams showing another process for fabricating a device structure including an intra-connection structure, in accordance with some embodiments. One or more fabrication processes (e.g., lithography, deposition, and/or etching) may be carried out to yield a structure as shown in FIG. 6(A). For example, a sacrificial dielectric material (e.g., an insulating material 520) that is formed between multiple gate structures (e.g., the gate structures 502, 504, 506 and 508) is removed (e.g., through etching) after a lithography process. One or more source/drain regions (e.g., the source/drain regions 512 and 514) are disposed between the gate structures and exposed at least partially after the removal of the sacrificial dielectric material. A spacer material is disposed on each gate structure. As shown in FIG. 6(A), the spacer material 510 covers at least part of the gate structure 504, e.g., on a top surface and sidewalls of the gate structure 504. For example, the spacer material 510 includes a dielectric material (e.g., silicon nitride).

Another lithography process is performed, and part of the spacer material 510 is removed (e.g., through etching) to expose part of the gate structure 504, as shown in FIG. 6(B). For example, the spacer material 510 on the top surface of the gate structure 504 is partially removed. In addition, the spacer material 510 on a side wall of the gate structure 504 adjacent to the source/drain region 512 is removed.

A conductive material 530 is formed (e.g., through lithography, deposition, etc.) on the gate structures and the source/drain regions. A CMP process is performed to remove part of the conductive material 530, as shown in FIG. 6(C). The conductive material 530 is in contact with the exposed gate structure 504 and the exposed source/drain regions 512 and is configured to electrically connect the gate structure 504 and the source/drain regions 512. For example, the conductive material 530 covers part of the top surface of the gate structure 504.

In certain embodiments, after the CMP process, the conductive material 530 does not cover any part of the top surface of the gate structure 504, and is disposed completely between the gate structure 504 and the source/drain regions 512. A dielectric material (e.g., an insulating material) 550 is formed (e.g., through deposition, etc.) to cover the gate structures.

Another conductive material is formed (e.g., through lithography, deposition, etc.) to fabricate multiple vertical conduction structures (e.g., vias). As shown in FIG. 6(D), a vertical conduction structure 540 (e.g., a via) is formed on the conductive material 530 between the gate structure 502 and the gate structure 504, and another vertical conduction structure 542 (e.g., a via) is formed on the conductive material 530 between the gate structure 506 and the gate structure 508. The conductive material 530 between the gate structure 504 and the gate structure 506 serves as an intra-connection structure (e.g., the intra-connection structure 214 or the intra-connection structure 216 as shown in FIG. 2(A), the intra-connection structure 294 or the intra-connection structure 296 as shown in FIG. 3(A)).

Figure 7:
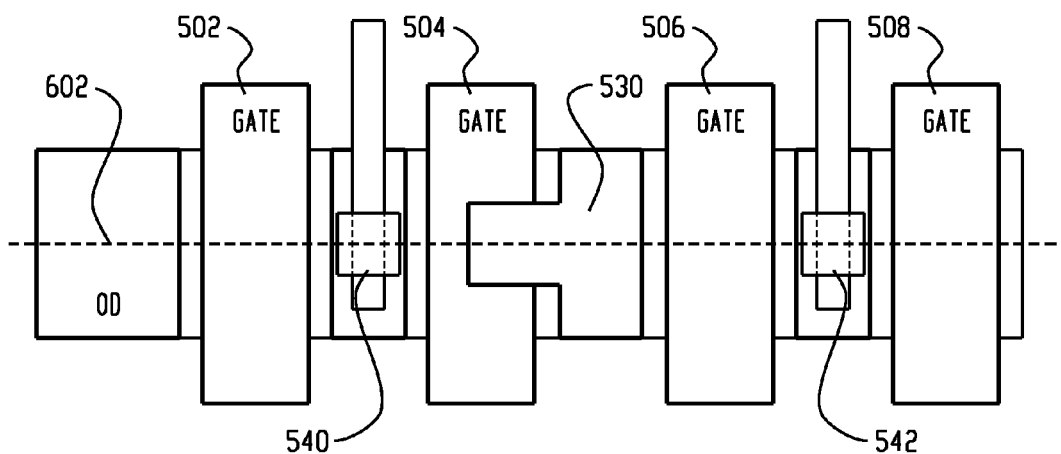
FIG. 7 depicts an example diagram showing a top view of the device structure as shown in FIG. 6(D), in accordance with some embodiments.

FIG. 7 depicts an example diagram showing a top view of the device structure as shown in FIG. 6(D), in accordance with some embodiments. As shown in FIG. 6(D) and FIG. 7, the intra-connection structure that includes the conductive material 530 between the gate structures 504 and 506 may not come into contact with the conduction structures 540 and 542. The cross-sectional view shown in FIG. 6(D) is associated with the cutline 602.

Figure 8:
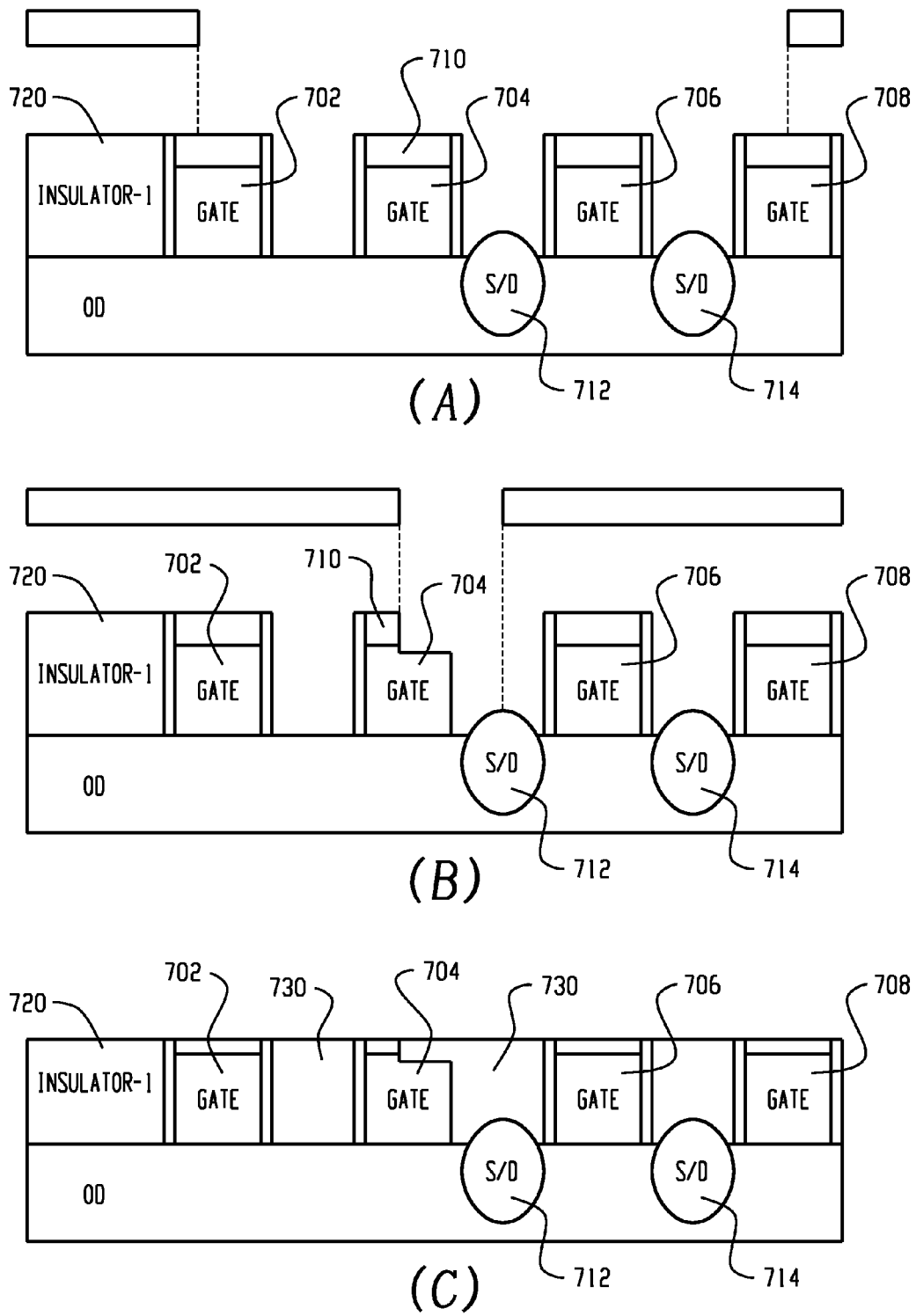
FIG. 8(A)-FIG. 8(E) depict example diagrams showing another process for fabricating a device structure including an intra-connection structure, in accordance with some embodiments.
Figure 8:
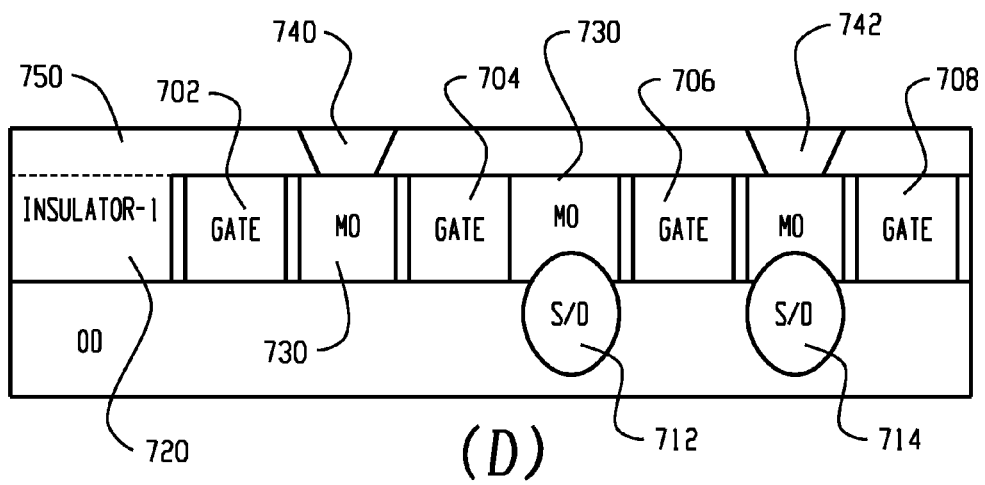
Figure 8:
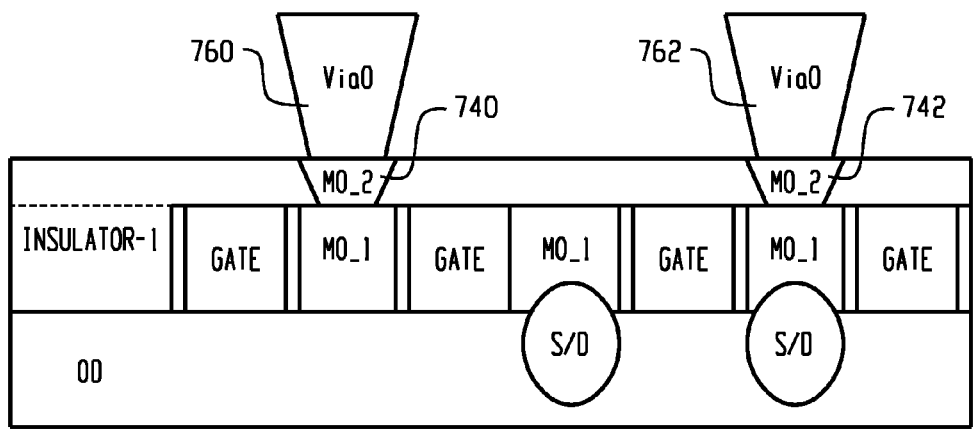

FIG. 8(A)-FIG. 8(D) depict example diagrams showing another process for fabricating a device structure including an intra-connection structure, in accordance with some embodiments. One or more fabrication processes (e.g., lithography, deposition, and/or etching) may be carried out to yield a structure as shown in FIG. 8(A). For example, a sacrificial dielectric material (e.g., an insulating material 720) that is formed between multiple gate structures (e.g., the gate structures 702, 704, 706 and 708) is removed (e.g., through etching) after a lithography process. One or more source/drain regions (e.g., the source/drain regions 712 and 714) are disposed between the gate structures and exposed at least partially after the removal of the sacrificial dielectric material. A spacer material is disposed on each gate structure. As shown in FIG. 8(A), the spacer material 710 covers at least part of the gate structure 704, e.g., on a top surface and sidewalls of the gate structure 704.

Another lithography process is performed, and part of the spacer material 710 is removed (e.g., through etching) to expose part of the gate structure 704, as shown in FIG. 8(B). For example, the spacer material 710 on the top surface of the gate structure 704 is partially removed. In addition, the spacer material 710 on a side wall of the gate structure 704 adjacent to the source/drain region 712 is removed.

A conductive material 730 is formed (e.g., through lithography, deposition, etc.) on the gate structures and the source/drain regions. A CMP process is performed to remove part of the conductive material 730, as shown in FIG. 4(C). The conductive material 730 is in contact with the exposed gate structure 704 and the exposed source/drain regions 712 and is configured to electrically connect the gate structure 704 and the source/drain regions 712. For example, the conductive material 730 covers part of the top surface of the gate structure 704.

In certain embodiments, after the CMP process, the conductive material 730 does not cover any part of the top surface of the gate structure 704, and is disposed completely between the gate structure 704 and the source/drain regions 712. A dielectric material (e.g., an insulating material) 750 is formed (e.g., through deposition, etc.) to cover the gate structures.

Another conductive material is formed (e.g., through lithography, deposition, etc.) to fabricate multiple vertical conduction structures (e.g., vias). As shown in FIG. 8(D), a vertical conduction structure 740 (e.g., a via) is formed on the conductive material 730 between the gate structure 702 and the gate structure 704, and another vertical conduction structure 742 (e.g., a via) is formed on the conductive material 730 between the gate structure 706 and the gate structure 708. The conductive material 730 between the gate structure 704 and the gate structure 706 serves as an intra-connection structure (e.g., the intra-connection structure 214 or the intra-connection structure 216 as shown in FIG. 2(A), the intra-connection structure 294 or the intra-connection structure 296 as shown in FIG. 3(A)). Higher level vertical conduction structures 760 and 762 (e.g., vias) may be fabricated (e.g., through lithography, deposition, etc.) on the conduction structures 740 and 742 respectively, as shown in FIG. 8(E).

Figure 9:
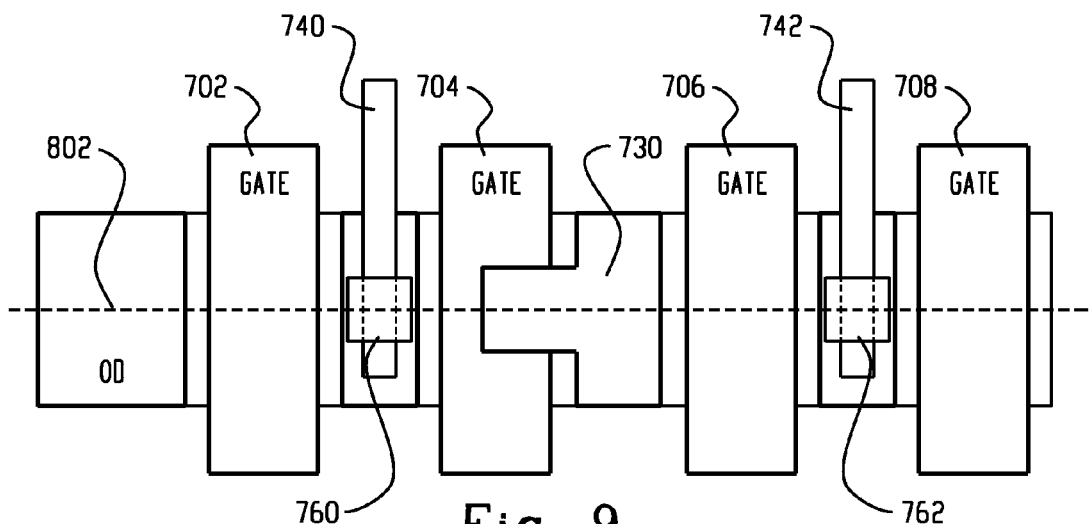
FIG. 9 depicts an example diagram showing a top view of the device structure as shown in FIG. 8(E), in accordance with some embodiments.

FIG. 9 depicts an example diagram showing a top view of the device structure as shown in FIG. 8(E), in accordance with some embodiments. As shown in FIG. 9, the conduction structures 740 and 742 extend parallel to the gate structures, and may be used for interconnection between different active regions. The intra-connection structure that includes the conductive material 730 between the gate structures 704 and 706 may not come into contact with the conduction structures 740, 742, 760 and 762. The cross-sectional view shown in FIG. 8(E) is associated with the cutline 802.

Figure 10:
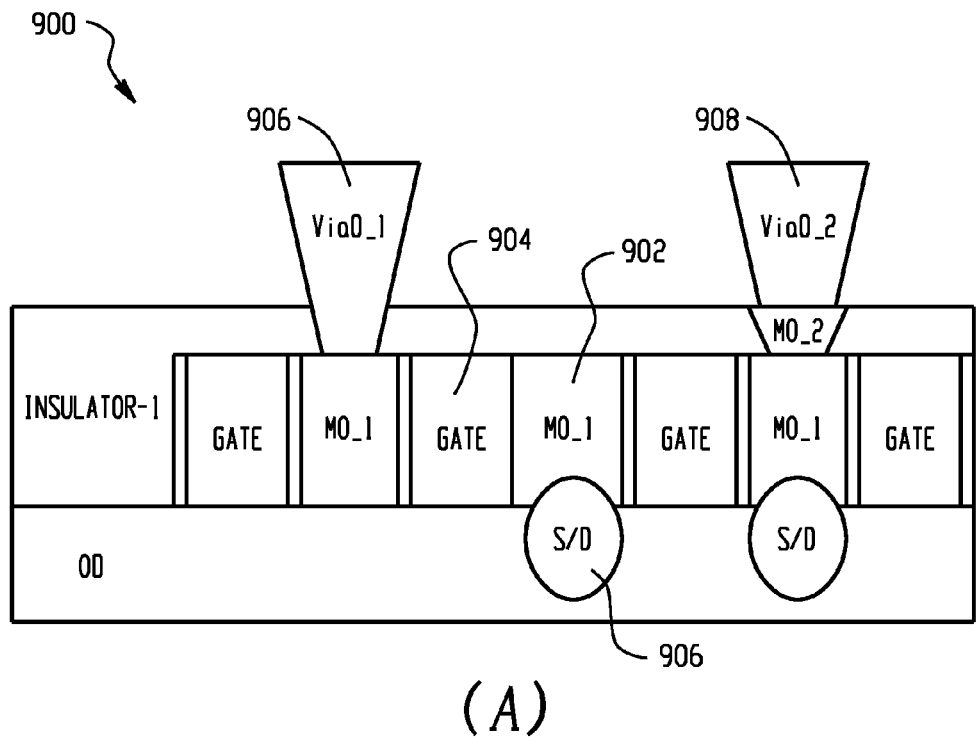
FIG. 10(A) depicts an example diagram showing a cross-sectional view of a device structure including an intra-connection structure, in accordance with some embodiments.
FIG. 10(B) depicts an example diagram showing a top view of the device structure as shown in FIG. 10(A), in accordance with some embodiments.
Figure 10:
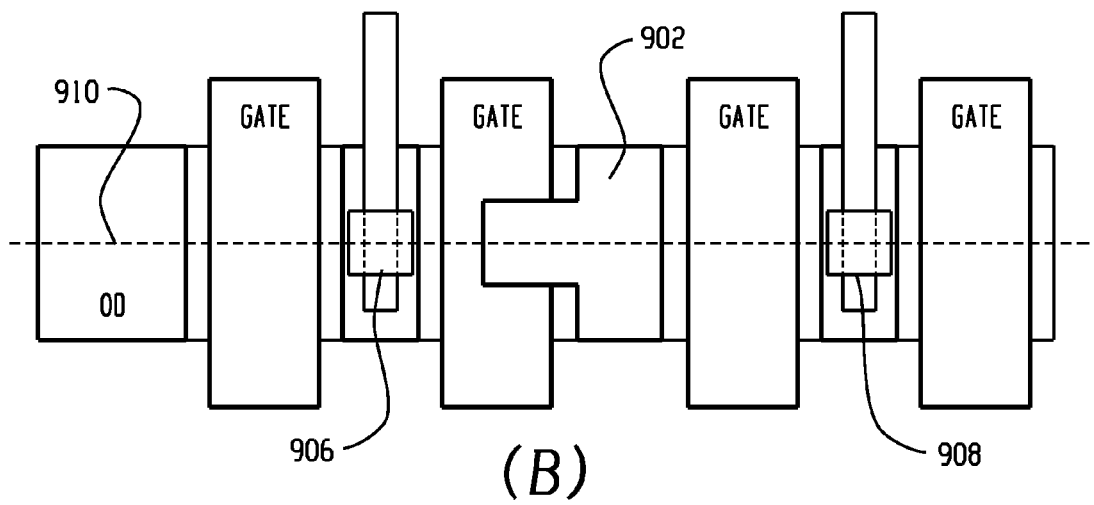
Figure 11A:
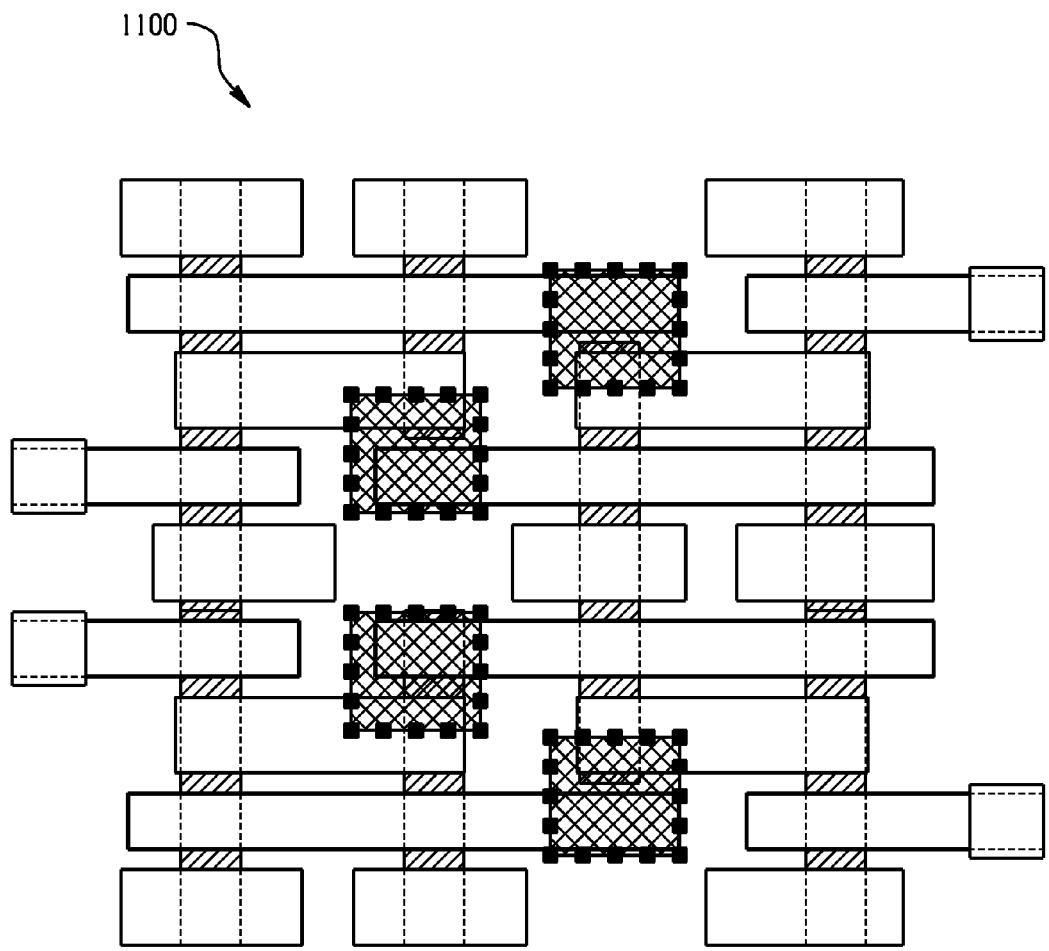
FIG. 11(A)-FIG. 11(E) depict example diagrams showing different masks for fabricating a device structure including an intra-connection structure, in accordance with some embodiments.
Figure 11B:
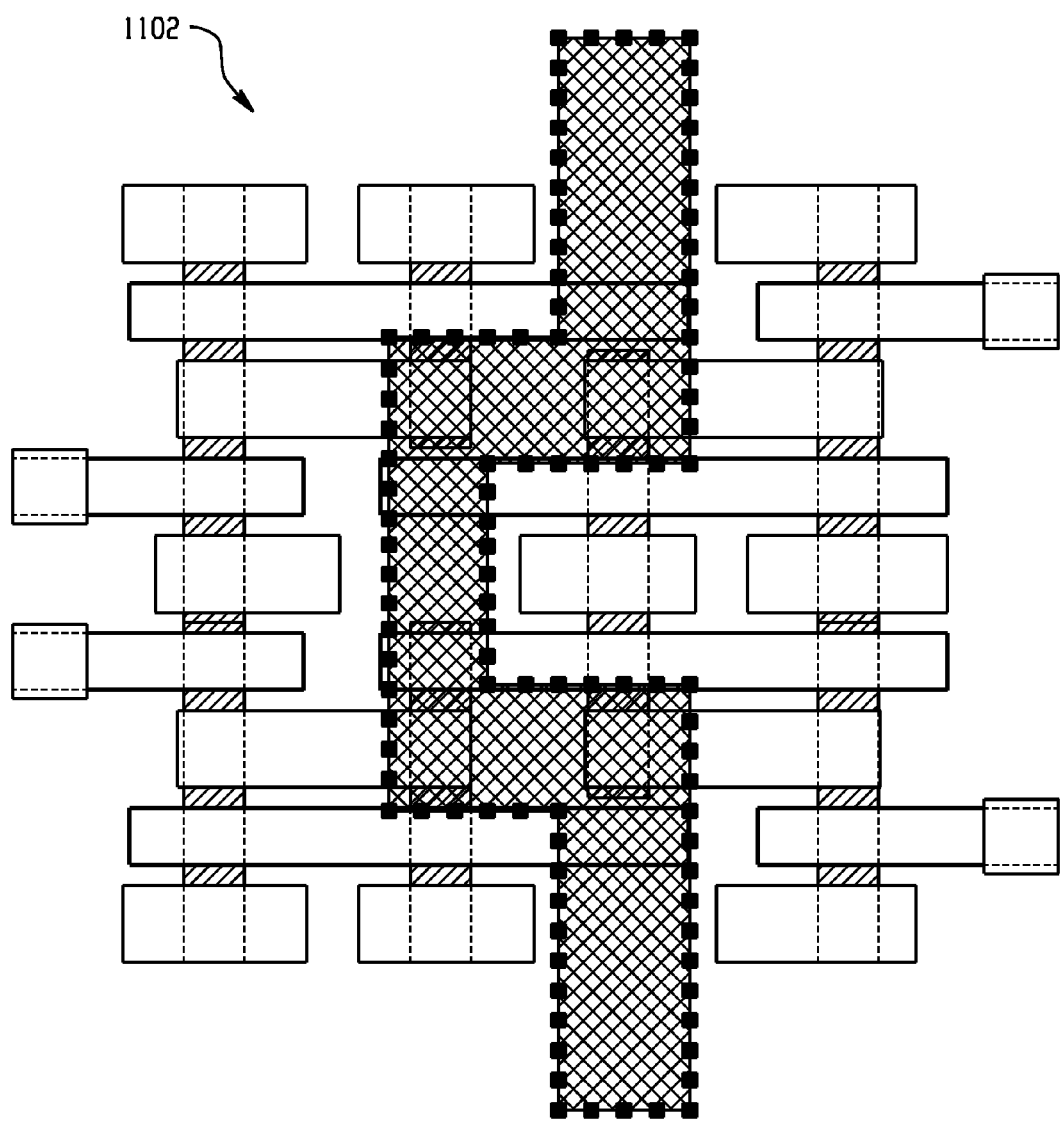
Figure 11C:
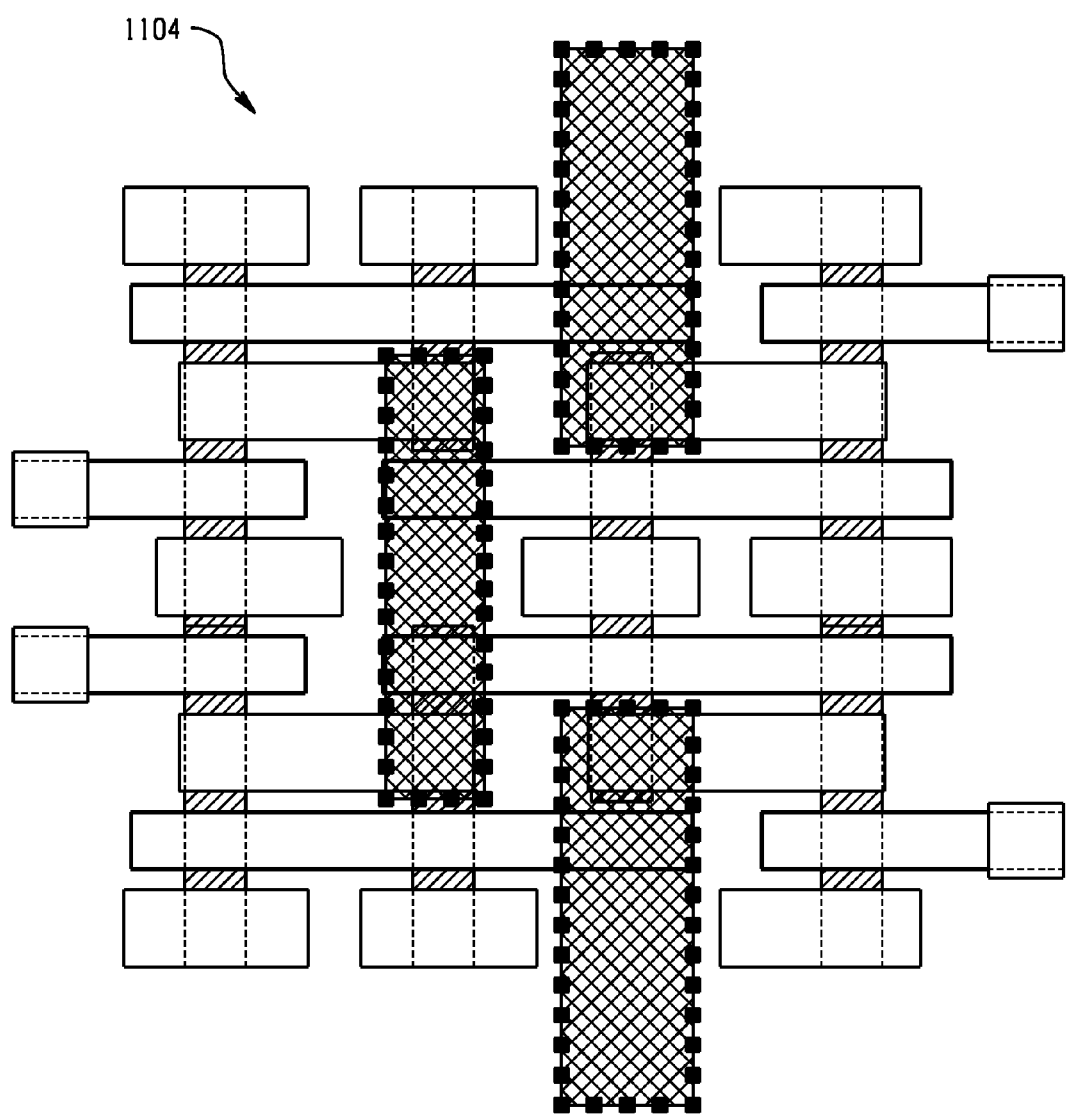
Figure 11D:
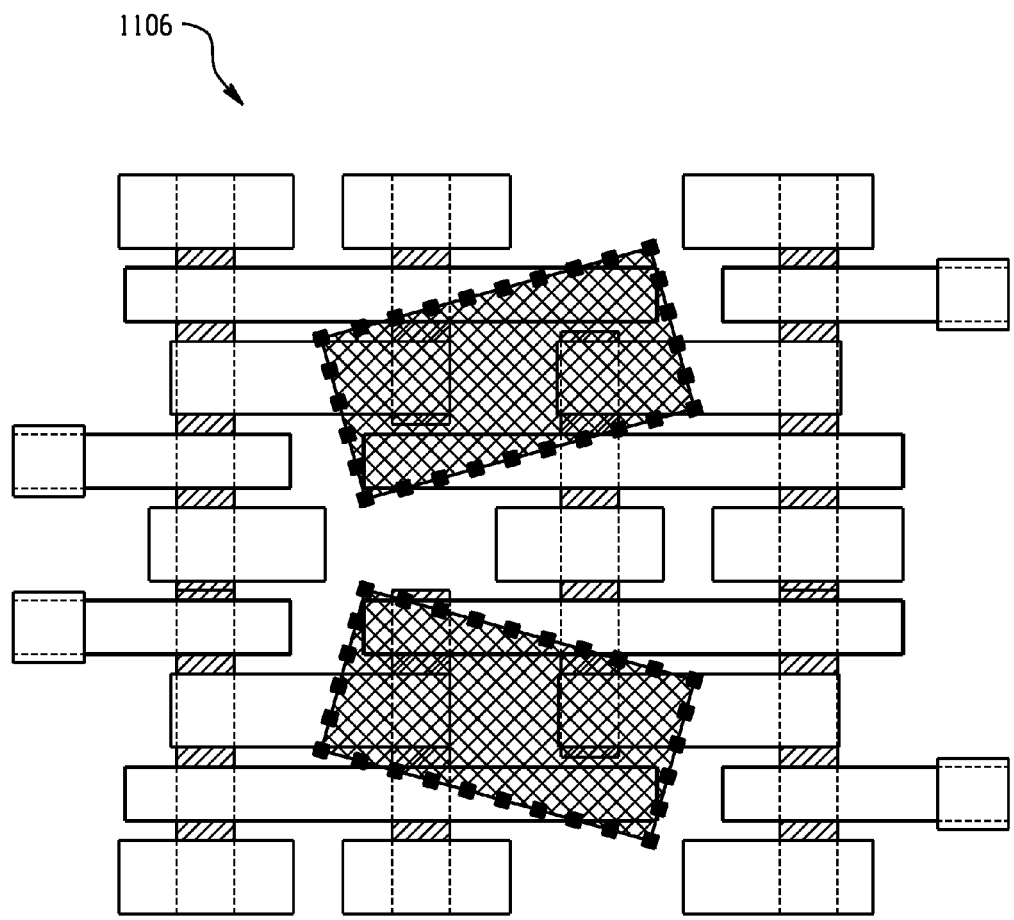
Figure 11E:
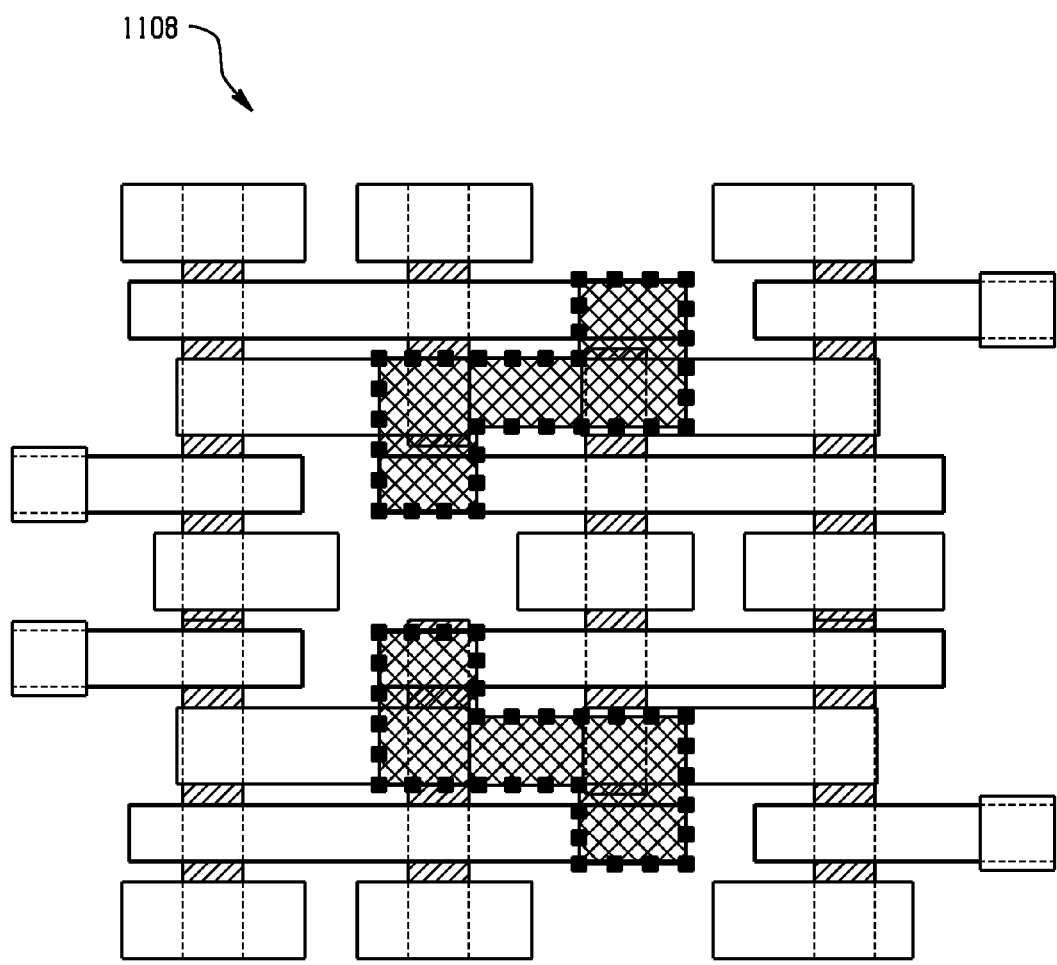

FIG. 10(A) depicts an example diagram showing a cross-sectional view of a device structure including an intra-connection structure, in accordance with some embodiments. The device structure 900 includes an intra-connection structure 902 between a gate structure 904 and a source/drain region 906. In addition, the device structure 900 includes different vertical conduction structures. As shown in FIG. 10(A), a vertical conduction structure 908 that includes a single conductive material may be formed through a process similar to what is shown in FIG. 6(A)-FIG. 6(D). Another vertical conduction structure 910 that includes two layers of conductive materials may be formed through a process similar to what is shown in FIG. 8(A)-FIG. 8(E). FIG. 10(B) depicts an example diagram showing a top view of the device structure as shown in FIG. 10(A), in accordance with some embodiments. The cross-sectional view shown in FIG. 10(A) is associated with the cutline 910.

FIG. 11(A)-FIG. 11(E) depict example diagrams showing different masks for fabricating a device structure including an intra-connection structure, in accordance with some embodiments. As shown in FIG. 11(A)-FIG. 11(E), the masks 1100, 1102, 1104, 1106 and 1108 can all be used for defining an intra-connection structure by removing part of a spacer material on a gate structure. Specifically, the mask 1100 includes simple pattern shapes with small pattern areas, and the mask 1102 may be implemented by a single patterning. In addition, the mask 1104 includes simple shapes with large pattern areas, and both the mask 1106 and the mask 1108 include large pattern areas.

Figure 12:
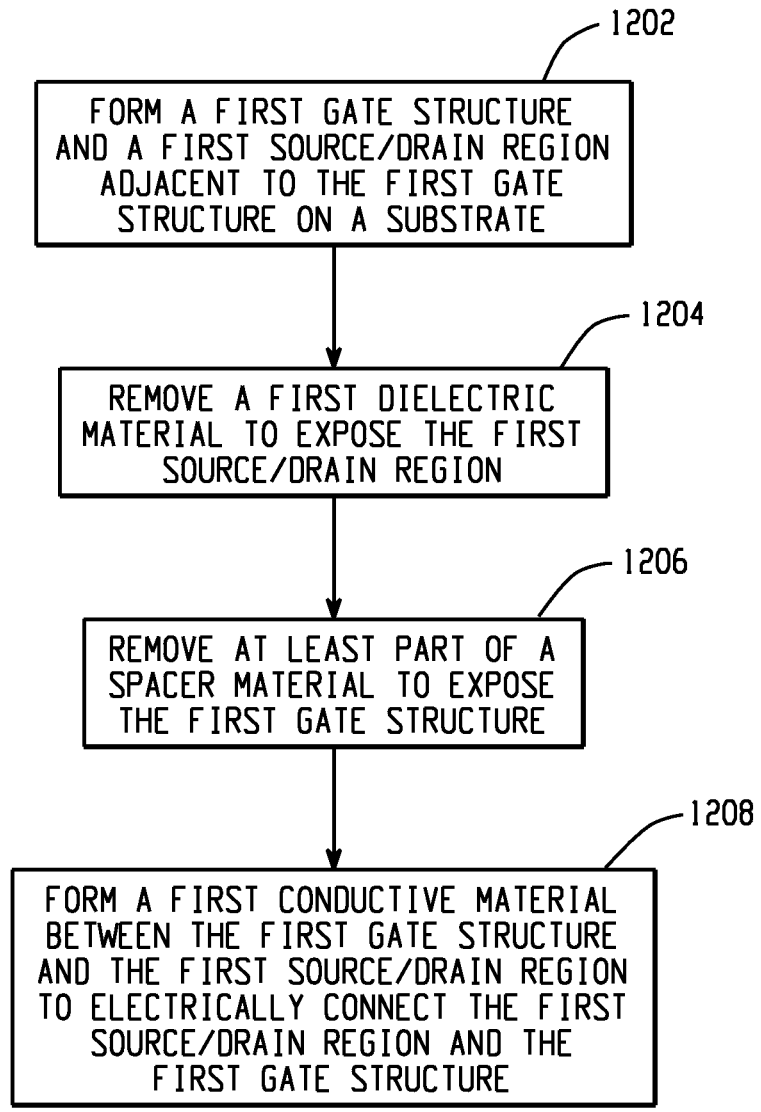
FIG. 12 depicts an example flow chart for fabricating a device structure including an intra-connection structure, in accordance with some embodiments.

FIG. 12 depicts an example flow chart for fabricating a device structure including an intra-connection structure, in accordance with some embodiments. At 1202, a first gate structure and a first source/drain region adjacent to the first gate structure are formed on a substrate. A first dielectric material is disposed on the first source/drain region. A spacer material is formed on the first gate structure. At 1204, the first dielectric material is removed to expose at least part of the first source/drain region. At 1206, at least part of the spacer material is removed to expose at least part of the first gate structure. At 1208, a first conductive material is formed between the first gate structure and the first source/drain region to electrically connect the first source/drain region and the first gate structure.

According to one embodiment, a method is provided for forming an intra-connection structure. A first gate structure and a first source/drain region adjacent to the first gate structure are formed on a substrate. A first dielectric material is disposed on the first source/drain region. A spacer material is formed on the first gate structure. The first dielectric material is removed to expose the first source/drain region. At least part of the spacer material is removed to expose the first gate structure. A first conductive material is formed between the first gate structure and the first source/drain region to electrically connect the first source/drain region and the first gate structure.

According to another embodiment, a structure includes: a first gate structure formed on a substrate, a first source/drain region adjacent to the first gate structure, and a first conductive material formed between the first gate structure and the first source/drain region. The first conductive material is in contact with part of the first gate structure and in contact with part of the first source/drain region.

According to yet another embodiment, a device includes: a gate structure associated with a first transistor, a source/drain region associated with a second transistor, the source/drain region being adjacent to the gate structure, and an intra-connection conductive material disposed in contact with a sidewall of the first gate structure and a top surface of the first source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a first gate structure formed on a substrate;
   a first source/drain region adjacent to the first gate structure;
   a first conductive material formed between the first gate structure and the first source/drain region, the first conductive material covering a first portion of a top surface of the first gate structure;
   a dielectric material that covers a second portion of the top surface of the first gate structure, wherein the first conductive material is in contact with part of the first gate structure and in contact with part of the first source/drain region; and
   a spacer material formed on a sidewall of the first gate structure, wherein the dielectric material, the first conductive material, and the spacer material are positioned at a substantially same height to form a substantially planar surface comprising uppermost surfaces of the respective dielectric material, first conductive material, and spacer material relative to the substrate, the substantially planar surface being higher than the top surface of the first gate structure relative to the substrate.

2. The structure of claim 1, wherein the first conductive material is configured to electrically connect the first gate structure and the first source/drain region.

3. The structure of claim 1, wherein:
   the first gate structure is associated with a first transistor; and
   the first source/drain region is associated with a second transistor.

4. The structure of claim 3, wherein a second conductive material is formed between a second source/drain region associated with the first transistor and a second gate structure associated with the second transistor to electrically connect the second source/drain region and the second gate structure.

5. The structure of claim 1, further comprising:
   a first dielectric material formed on the first conductive material;
   a second source/drain region adjacent to the first gate structure; and
   a second conductive material formed on the second source/drain region, wherein the spacer material is formed between the second conductive material and the first gate structure.

6. The structure of claim 5, further comprising:
a conductive structure formed on the second conductive material for applying a voltage on the second source/drain region, the conductive structure including one or more third conductive materials.

7. The structure of claim 1, wherein a top surface of the first conductive material is higher than the top surface of the first gate structure relative to the substrate.

8. The structure of claim 1, wherein the first conductive material is in contact with a second sidewall of the first gate structure.

9. The structure of claim 1, wherein the first conductive material is in contact with a top surface of the first source/drain region.

10. The structure of claim 1, wherein the dielectric material is sandwiched between the spacer material and the first conductive material.

11. The structure of claim 1, wherein the first conductive material comprises a T-shaped portion.

12. The structure of claim 1, further comprising a vertical conductive structure formed above the substantially planar surface.

13. A device comprising:
a gate structure associated with a first transistor;
a source/drain region associated with a second transistor, the source/drain region being adjacent to the gate structure, wherein a portion of the source/drain region is disposed in a same vertical level as the gate structure;
an intra-connection conductive material disposed in contact with a first sidewall of the gate structure and a top surface of the source/drain region, the intra-connection conductive material covering a first portion of a top surface of the gate structure;
a dielectric material that covers a second portion of the top surface of the gate structure; and
a spacer material formed on a second sidewall of the gate structure, wherein the dielectric material, the intra-connection conductive material, and the spacer material are positioned at a substantially same height to form a substantially planar surface comprising uppermost surfaces of the respective dielectric material, intra-connection conductive material, and spacer material relative to a substrate on which the gate structure is formed, the substantially planar surface being higher than the top surface of the gate structure relative to the substrate.

14. The device of claim 13, wherein the intra-connection conductive material is configured to electrically connect the gate structure and the source/drain region.

15. The device of claim 13, wherein a top surface of the intra-connection conductive material is higher than the top surface of the gate structure relative to the substrate.

16. The device of claim 13, wherein the intra-connection conductive material is disposed laterally between the gate structure and the source/drain region.

17. The device of claim 13, wherein the spacer material is not formed on the first sidewall.

18. The device of claim 13, wherein the first transistor corresponds to a first pull-up transistor of a static random access memory (SRAM) cell, and the second transistor corresponds to a second pull-up transistor of the SRAM cell.

19. The device of claim 13, wherein the dielectric material is sandwiched between the spacer material and the intra-connection conductive material.

20. The device of claim 13, wherein the intra-connection conductive material comprises a T-shaped portion.

21. The device of claim 13, further comprising a vertical conductive structure formed above the substantially planar surface.

22. A device comprising:
a gate structure formed on a substrate;
a source/drain region adjacent to the gate structure, a portion of the source/drain region being disposed in a same vertical level as the gate structure;
a conductive material disposed laterally between the gate structure and the source/drain region, the conductive material (i) being in contact with a first sidewall of the gate structure and a top surface of the source/drain region, (ii) electrically connecting the gate structure and the source/drain region, and (iii) covering a first portion of a top surface of the gate structure;
a dielectric material that covers a second portion of the top surface of the gate structure; and
a spacer material formed on a second sidewall of the gate structure, wherein the dielectric material, the conductive material, and the spacer material are positioned at a substantially same height to form a substantially planar surface comprising uppermost surfaces of the respective dielectric material, conductive material, and spacer material relative to the substrate, the substantially planar surface being higher than the top surface of the gate structure relative to the substrate.

23. The device of claim 22, wherein the gate structure is associated with a first transistor, and the source/drain region is associated with a second transistor.

24. The device of claim 23, wherein the first transistor corresponds to a first pull-up transistor of a static random access memory (SRAM) cell, and the second transistor corresponds to a second pull-up transistor of the SRAM cell.

25. The device of claim 22, wherein the spacer material is not formed on the first sidewall.

26. The device of claim 22, wherein the dielectric material is sandwiched between the spacer material and the conductive material.

27. The device of claim 22, wherein the conductive material comprises a T-shaped portion.

28. The device of claim 22, further comprising a vertical conductive structure formed above the substantially planar surface.

* * * * *